(12) United States Patent
Olson et al.

(10) Patent No.: US 9,883,603 B2
(45) Date of Patent: Jan. 30, 2018

(54) ELECTRONIC PULL TAB FOR BATTERY PROTECTION

(71) Applicant: Texas Instruments Incorporated, Dallas, TX (US)

(72) Inventors: Thomas Brian Olson, Allen, TX (US); Alan Robert Ladd, The Colony, TX (US); Mark Lynn Shipley, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 927 days.

(21) Appl. No.: 14/281,298

(22) Filed: May 19, 2014

(65) Prior Publication Data

US 2015/0022956 A1    Jan. 22, 2015

Related U.S. Application Data

(60) Provisional application No. 61/846,717, filed on Jul. 16, 2013.

(51) Int. Cl.
*H05K 7/00* (2006.01)
*H02J 9/00* (2006.01)
*H02J 7/00* (2006.01)

(52) U.S. Cl.
CPC ............... *H05K 7/00* (2013.01); *H02J 9/002* (2013.01); *H02J 7/0063* (2013.01)

(58) Field of Classification Search
CPC ............................... H05K 7/00; G06F 1/3296
See application file for complete search history.

(56) References Cited

U.S. PATENT DOCUMENTS

| | | | | |
|---|---|---|---|---|
| 6,271,605 | B1 * | 8/2001 | Carkner | H02J 7/0031 307/125 |
| 6,459,175 | B1 * | 10/2002 | Potega | B60L 11/185 307/132 M |
| 2003/0126480 | A1 * | 7/2003 | Song | G06F 1/1613 713/300 |

* cited by examiner

*Primary Examiner* — Jeffrey Shin
(74) *Attorney, Agent, or Firm* — Rose Alyssa Keagy; Charles A. Brill; Frank D. Cimino

(57) ABSTRACT

A battery powered device is configured to allow the device to be stored for extended periods of time with a lithium battery installed and operable. An electronic switch is coupled between the battery and processing logic of the device and is biased off to block all current flow to the processing logic while the device is in a storage state. A user may perform a simple action to overcome the bias such that the electronic switch is turned on and allows current to flow to the processing logic in an operational state. Later, the user may perform another simple action to restore the bias such that the electronic switch is turned off to return the device to the storage state in which essentially no current is drained from the battery.

16 Claims, 8 Drawing Sheets

ELECTRONIC PULL TAB FOR BATTERY PROTECTION

CLAIM OF PRIORITY UNDER 35 U.S.C. 119(e)

The present application claims priority to and incorporates by reference U.S. Provisional Application No. 61/846,717, filed Jul. 16, 2013, entitled "Method to provide long term storage capability for a mobile product with built-in Lithium Ion battery—Electronic Pull Tab."

FIELD OF THE INVENTION

This invention generally relates to battery powered devices, and in particular to devices that use Lithium batteries.

BACKGROUND OF THE INVENTION

Products equipped with Lithium Ion batteries run the risk of limited shelf life due to current draining from the Lithium Ion battery into the device and then exposing the battery to a detrimental low voltage condition. This can occur both in the original shipment of the product, its life of the store shelf or during its life time during periods of infrequent usage.

Various mechanisms have been used to address this issue. In some devices, the Lithium battery is not installed by the device manufacturer; an end user must install the battery before using the device. In other cases, pull tabs are applied to one or both battery terminals to disconnect the battery from its circuitry. In this case, the end user must remove the pull tab before first usage. These steps require initial user intervention before the device can be used.

SUMMARY

A battery powered device is configured to allow the device to be stored for extended periods of time with a lithium battery installed and operable. An electronic switch is coupled between the battery and processing logic of the device and is biased off to block all current flow to the processing logic while the device is in a storage state. A user may perform a simple action to overcome the bias such that the electronic switch is turned on and allows current to flow to the processing logic in an operational state. Later, the user may perform another simple action to restore the bias such that the electronic switch is turned off to return the device to the storage state in which essentially no current is drained from the battery. Alternatively, the device may be returned to the storage state directly with no user action after a period of inactivity.

BRIEF DESCRIPTION OF THE DRAWINGS

Particular embodiments in accordance with the invention will now be described, by way of example only, and with reference to the accompanying drawings.

Figure 1:
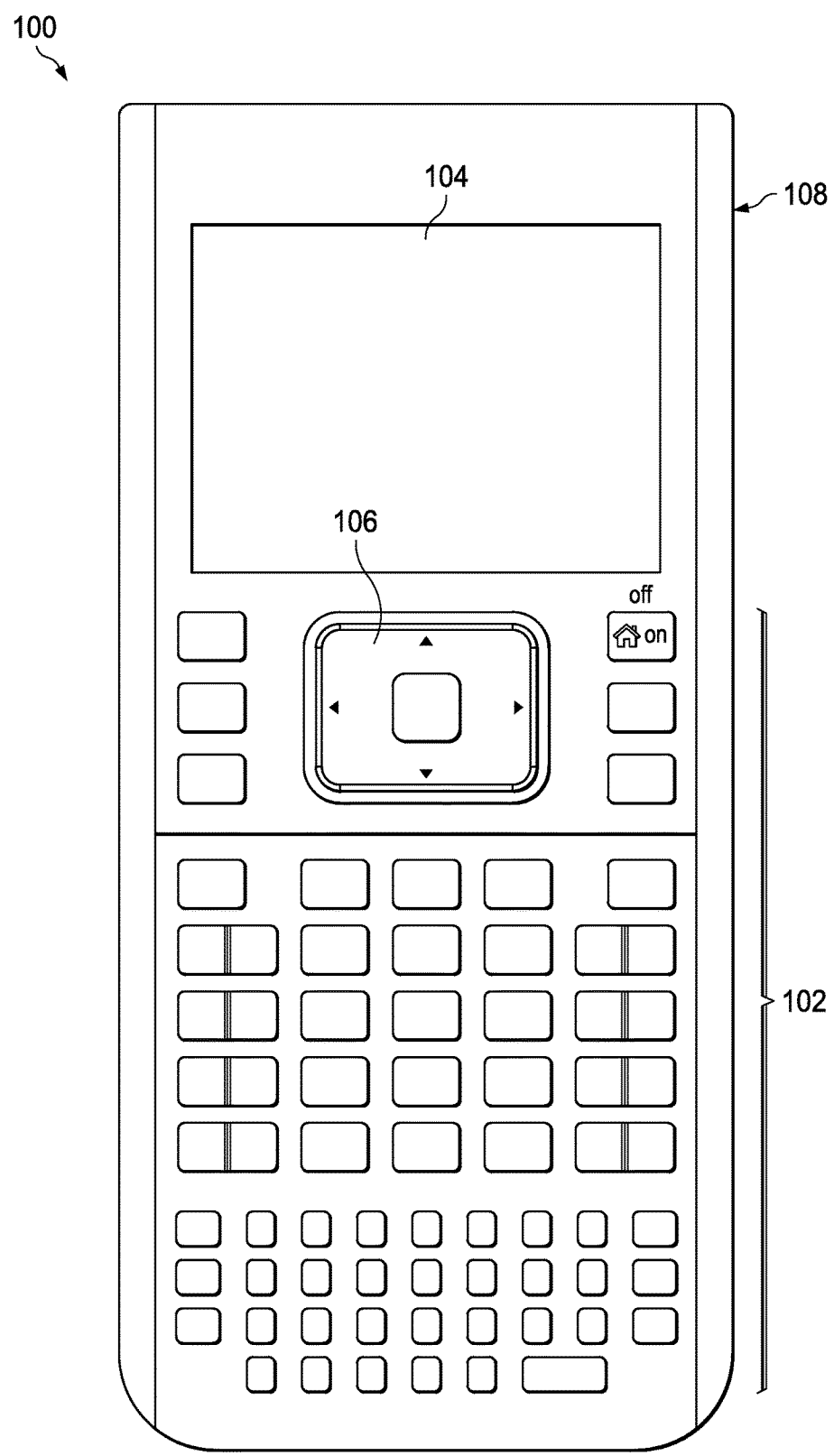
FIG. 1 is an illustration of an example electronic device that includes an electronic pull tab to isolate its battery during extended periods of non-use.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency.

Lithium ion chemistry prefers partial discharge to deep discharge, so it's best to avoid discharging the battery all the way down to zero. Since lithium-ion chemistry does not have a "memory", a partial discharge does not harm the battery pack. However, if the voltage of a lithium-ion cell drops below a certain level it may be ruined. After a Lithium battery powered device is manufactured, there is a problem with what to do to prevent the Lithium battery from becoming discharged to a dangerously low point that may ruin the battery.

Many electronic products may have a "vampire" circuit included within them that drains a small amount of current from the battery, even when the device is turned off. Vampire circuits may provide various simple functions, such as: a time of day clock circuit, a reminder alarm circuit, maintaining memory content, etc., for example. Vampire circuits may also be more complicated and involve waking a processor for periodic status checks or communication sessions, etc., for example.

Various mechanisms have been used to address this issue. In some devices, the Lithium battery is not installed by the device manufacturer. In this case, an end user must install the battery before using the device. In other cases, pull tabs may be applied to one or both battery terminals to disconnect the battery from its circuitry. In this case, the end user must remove the pull tab before first usage. These steps require initial user intervention before the device can be used and do not address the issue of storage during infrequent use periods, such as a school summer vacation for school related devices such as calculators and other instructional electronic devices.

A solution for seasonal storage is to remove the battery from the product. This requires that the battery be easily accessible to the user and requires user intervention to remove the battery before storing it for an extended period of time. This may make the device housing more complex and expensive. This also exposes the product to the possibility of inferior substitute batteries since they are readily replaceable.

A mechanical pull tab solution allows the battery to be installed in the product but requires an extra mechanical piece to isolate the battery contacts from the circuitry. This requires the user to remove the piece and does not easily provide for periods of storage during the life of the product.

Another solution is to provide the device with a mechanical switch that controls turning on power to the device. This involves additional expense and requires special mechanical considerations for placement of a slide, toggle, or similar two position switch that can be mechanically either closed or open.

Embodiments of the invention may include electronic pull tab that provides the features of a mechanical pull tab by electrically disconnecting the battery from its primary current load thus permitting long term storage while providing instant access to the functionality of the device without requiring pull tab removal or battery installation. In addition, the electronic pull tab may be re-instituted with minor impact to the user to support periodic seasons of storage as if a mechanical pull tab was re-installed.

The electronic pull tab allows for the battery to be installed in the product and does not require user intervention when the product is ready to be used. For some types of devices, this may allow the battery to be permanently encased within the device housing. In other types of devices, this may allow the battery compartment to be secured with screws or other mechanical restraints, for example. Since the electronic pull tab is re-settable, the battery may be left in the unit and no additional removable piece is required for either its initial or subsequent operations.

FIG. 1 is an illustration of an example electronic device 100 that includes an electronic pull tab to isolate its battery during extended periods of non-use. For illustrative purposes, embodiments may be described herein with reference to the TI-Nspire CX™ handheld graphing calculators and the TI-Nspire CX™ software available from Texas Instruments. One of ordinary skill in the art will appreciate that embodiments are not limited to the TI-Nspire CX™ calculator and TI-Nspire CX™ software.

Handheld calculators with more or fewer components may be used in embodiments of the invention. As shown in FIG. 1, the handheld calculator 100 includes a graphical display 104, and a keypad 102 that includes a touchpad 106. The graphical display 104 may be used to display, among other things, information input to applications executing on the handheld calculator 100 and various outputs of the applications. The graphical display 104 may be, for example, an LCD display. The keypad 102 allows a user, e.g., a student or instructor, to enter data and functions and to start and interact with applications executing on the handheld calculator 100. The keypad 102 also includes an alphabetic keyboard for entering text. The touchpad 106 allows a user to interact with the display 104 by translating the motion and position of the user's fingers on the touchpad 106 to provide functionality similar to using an external pointing device, e.g., a mouse. A user may use the touchpad 106 to perform operations similar to using a pointing device on a computer system, e.g., scrolling the display 104 content, pointer positioning, selecting, highlighting, etc. Calculator 100 is enclosed within a housing 108 that also contains a battery that provides power to operate calculator 100.

Figure 2:
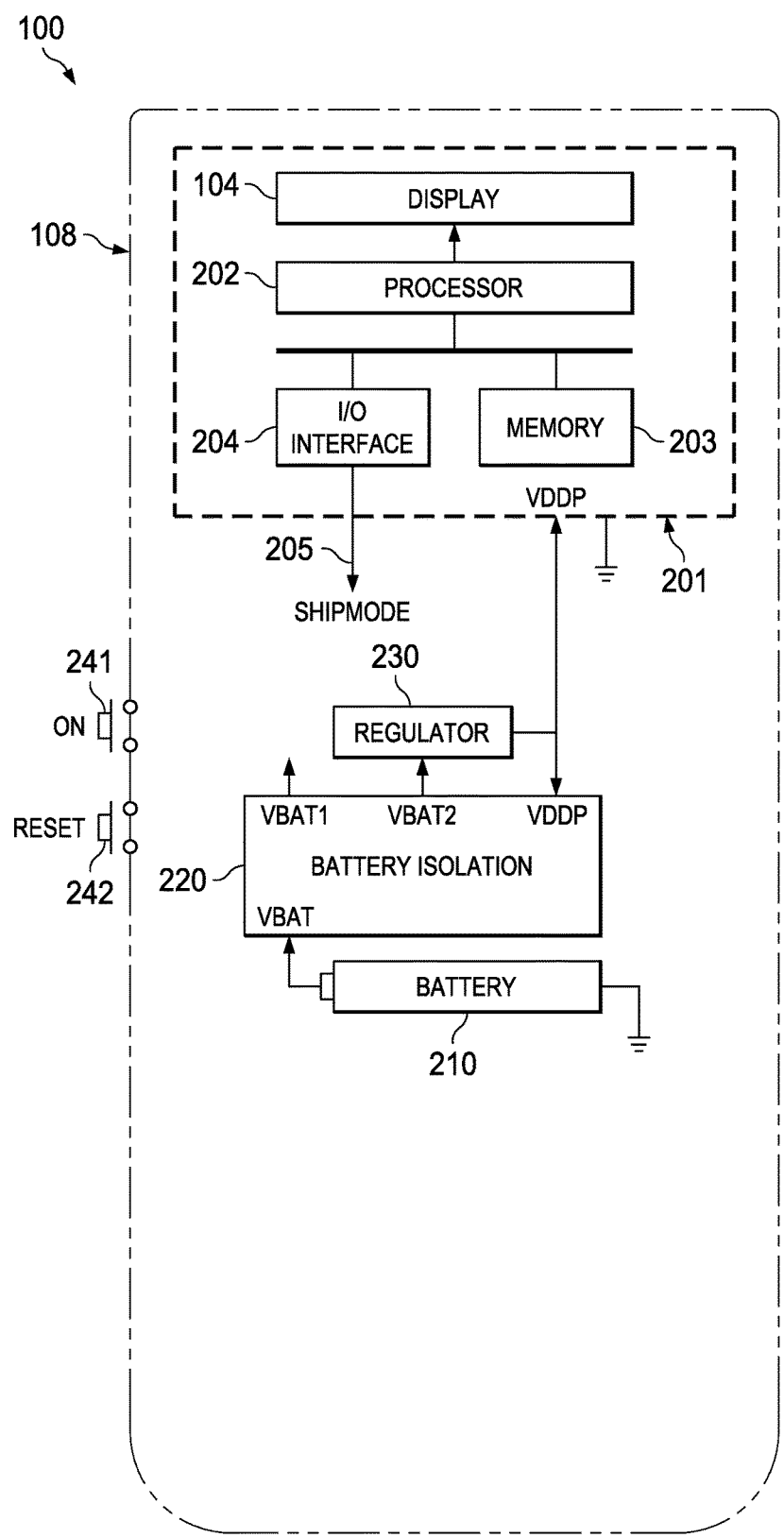
FIG. 2 is a block diagram of the electronic device of FIG. 1.

FIG. 2 is a block diagram of the electronic device 100 of FIG. 1. Processing logic 201 and battery 210 is packaged within housing 108. The term "processing logic" as used herein refers to all, or at least most, of the circuitry that provides the functionality of device 100. In this example, the processing logic includes a microprocessor 202 that is coupled to a memory 203 that may include one or both of read-only memory (ROM) and random-access memory (RAM). In some embodiments, the ROM stores software programs implementing functionality described herein and the RAM stores intermediate data and operating results, for example. In some embodiments, a portion of the memory may be non-volatile, such as a flash memory or FRAM (Ferroelectric read only memory) for example. I/O interface logic 204 is coupled to processor 202 and provides an interface to keyboard 102 and touch pad 106, referring back to FIG. 1. I/O interface logic may also include one or more outputs that may be controlled by a program executed by processor 202 to generate control signals, such as control signal shipmode 205, which will be described in more detail below. Display 104 is coupled to and controlled by processor 202. The general operation of electronic devices such as device 100, which in this case is a hand held calculator, is well known and need not be described in further detail herein.

Battery 210 may be a lithium battery, for example. As discussed above, an electronic battery isolation circuit 220 allows device 100 to be placed in a storage state in which essentially all current drain from battery 210 is prevented, just as if a mechanical pull tab is placed on the terminals of the battery. As will be described in more detail below, when device 100 is turned on, battery isolation circuit 220 is enabled to provide voltage to regulator 230 that in turn provides power to processing logic 201, just as if a mechanical pull tab had been removed. In this example, regulator 230 is a low drop out (LDO) regulator that provides a constant voltage level to processing logic 201. In other embodiments, another type of regulator or regulators may be used, or in some embodiments a regulator may not be needed if the processing logic is more tolerant of variations in battery voltage level, for example.

In this example, two momentary push button switches 241, 242 are used to control battery isolation circuit 220. These switches may be part of keypad 102, for example, or may be located in a different area of housing 108. In this example, switch 241 is used to turn on device 100, while switch 242 may be a reset switch such as a "clear entry" button. As such, switches 241, 242 may perform other functions for device 100 and need not be dedicated switches just to control battery isolation circuit 220.

Figure 3:
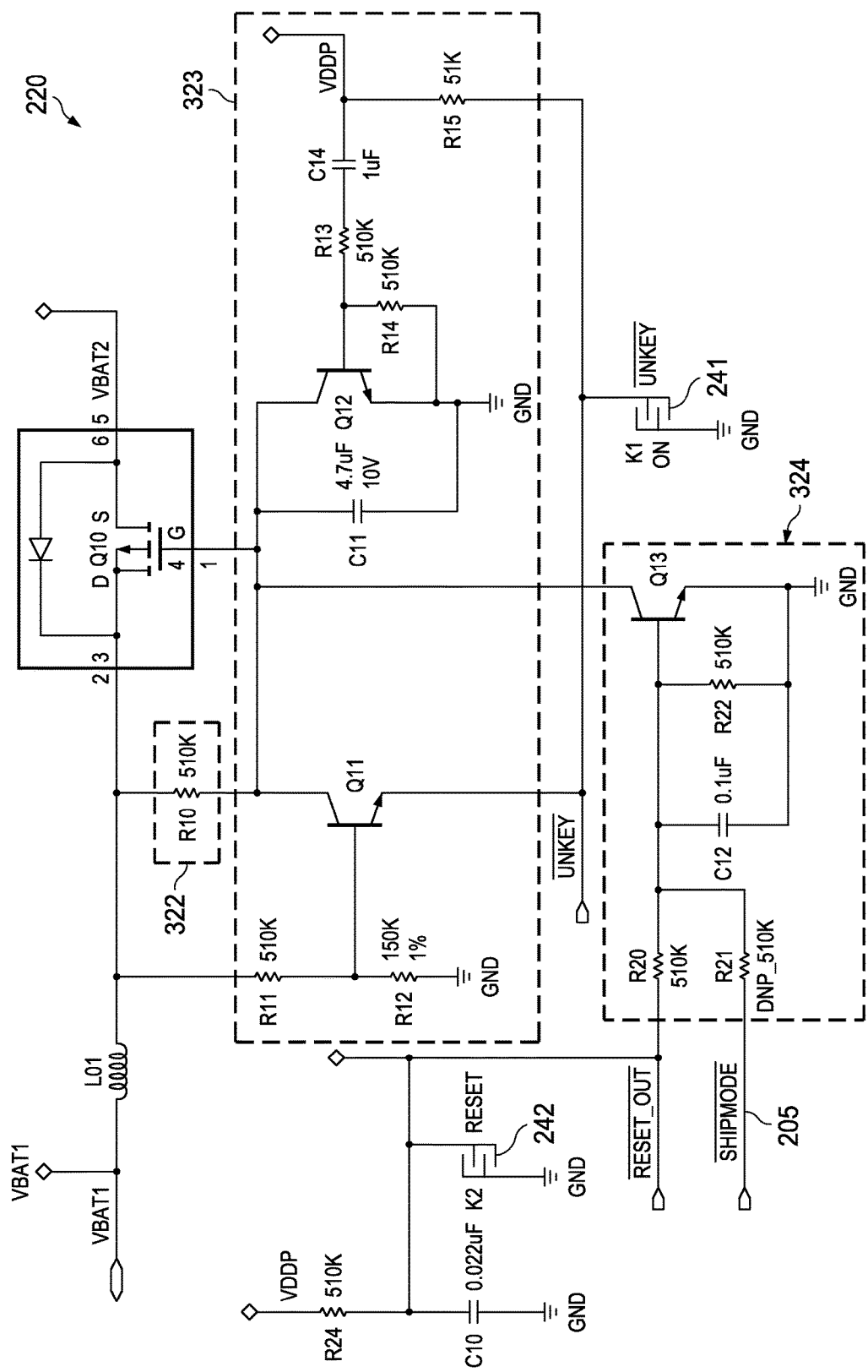
FIG. 3 is a schematic of a battery isolation circuit for the device of FIG. 1.

FIG. 3 is a schematic of a battery isolation circuit 220 for device 100 of FIG. 1. In this example circuit, transistor Q10 is a MOS (metal on silicon) type transistor, such as a P channel enhancement type device, for example. Bias circuit 322 is connected to the gate of transistor Q10 and is configured to hold control transistor Q10 off to block all current flow to the processing logic 201 while the device is in a storage state for shipping or long term storage. In this example, bias circuit 322 is simply resistor R10 that is coupled between the gate and drain terminals of control transistor Q10. As long as the gate is at or near the same potential as the drain, transistor Q10 will not conduct any current. This allows device 100 to be stored for long periods of time with the battery installed without draining the battery charge.

Override circuit 323 is coupled to bias circuit 322 and to a momentary switch 241. The override circuit is configured to override the bias circuit in response to activation of the ON momentary switch such that the control transistor Q10 is turned on and allows current to flow to the processing logic during an operational state.

When ON button 241 is pressed, transistor Q11 turns on and pulls the gate of transistor Q10 towards ground which allows current to flow through transistor Q10 to bring up the VBAT2 voltage. This in turns enables the system power supply regulator 230 to produce regulated voltage VDDP that is in turn provided to processing function circuitry 201. The capacitor C14 provides a timed momentary turn on of Q12 which holds Q10 in the ON condition for a period of time after momentary switch 241 is released. Once the RESET_OUT signal is deactivated to indicate voltage VDDP is stable and the processing circuit 201 is ready to operated, transistor Q13 is turned on by the hi logic voltage provided by the RESET_OUT/coupled to its base and it holds Q10 in the on condition.

A user of device 100 may decide to store the device for a long period of time. In this case, they may press the reset key 242 and hold it for a period of time. While reset switch 242 is activated, the base of transistor Q13 is tied to ground through resistor R20. After a short period of time, capacitor C12 is discharged by resistors R20 and R22 in parallel and then Q13 is turned off. Once Q13 is turned off, bias circuit 322 will charge capacitor C11 to a high enough value to turn off transistor Q10 after another period of time. In this example, the values of resistor R20, R22, C12, R10, and capacitor C11 are selected to require reset switch 242 be activated for approximately two seconds or more to place device 100 into storage mode. Pressing the reset switch for a period of time that is less than approximately two seconds just performs a normal reset function on processing logic 201.

In some embodiments, a shipmode signal 205 from a general purpose input/output (GPIO) driver may also be used to place device 100 into storage mode in response to an application executed by processing logic 201. This feature may allow software on the device to determine when the device has not been used for an extended period of time. For example, an internal timer or time of day clock may be queried to determine when an extended period of time has passed without other activity. For example, a time period of three or four days or more may be appropriate for some types of devices. Since going into shipmode removes power from all of the processing logic, some device initialization may be required the next time it is restarted, such as time of day, for example. Therefore, the delay period should be long enough so that a user is not inconvenienced by this occurrence. For short periods of time, it may be more appropriate to place a device in a conventional low power or hibernate mode in which power is maintained to some critical processing circuitry. In this manner, a device may place itself in ship mode so that the battery life is preserved during extended periods of non-use.

In this example, the reset state for shipmode signal 205 is high. When shipmode signal 205 is set low by software executed in processing logic 201, the base of transistor Q13 is tied to a low logic level through resistor R21. After a short period of time, capacitor C12 is discharged by resistors R21 and R22 in parallel and then Q13 is turned off. Once Q13 is turned off, bias circuit 322 will charge capacitor C11 to a high enough value to turn off transistor Q10 after another period of time. In this example, the values of resistor R21, R22, C12, R10, and capacitor C11 are selected to require shipmode signal 205 be activated for approximately two seconds or more to place device 100 into storage mode.

Figure 4:
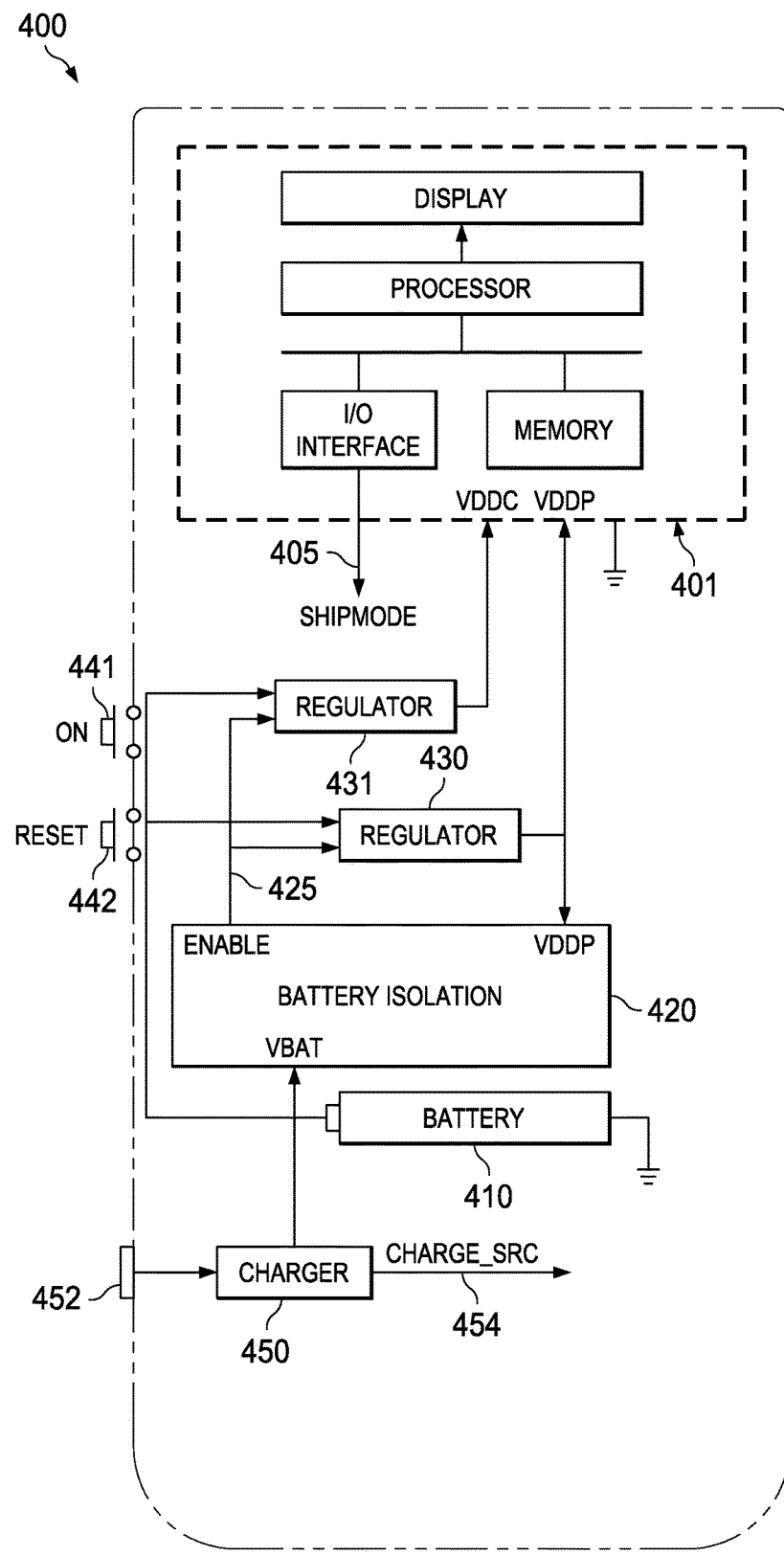
FIG. 4 is a block diagram of another electronic device.
Figure 5:
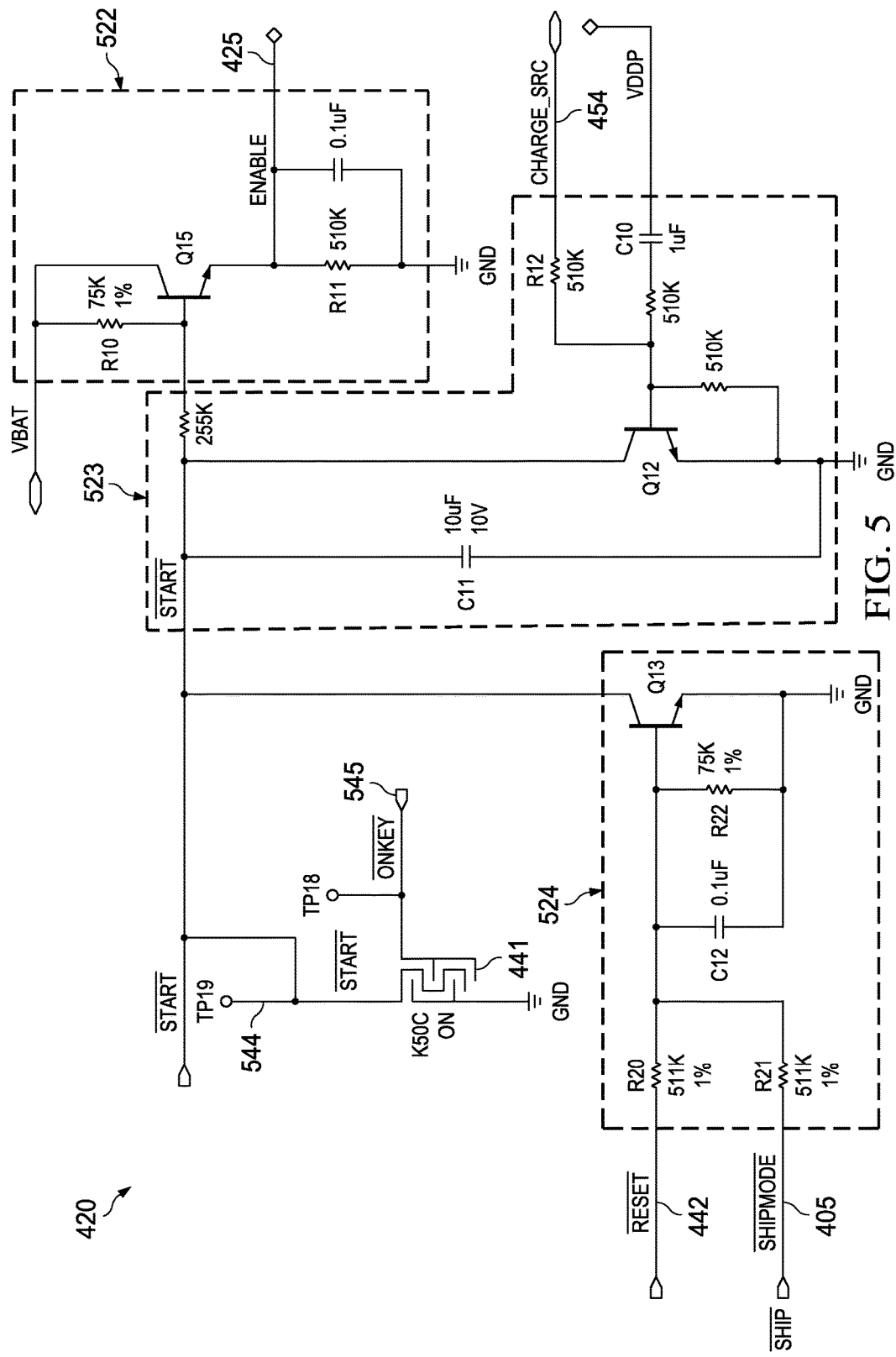
FIG. 5 is a schematic of a battery isolation circuit for the device of FIG. 4.

This is just an example circuit. It should be understood that there are many ways to implement a similar electronic pull tab function. FIGS. 4 and 5 illustrate another embodiment. FIG. 4 is a block diagram of another electronic device 400 that may be similar to the device 100 but with a different implementation for the battery isolation circuit. In this example, processing logic 401 is similar to processing logic 201. ON button 441 and Reset button 442 may be used in a similar manner as in device 100.

In this example, battery 410 is connected to battery isolation device 420. However, battery 410 is also directly connected to one or more regulators. In this example, two regulators 430-431 are provided, one for core voltage VDDC and one for a peripheral device voltage VDDP. While device 400 is in ship mode, all of the regulators are turned off and prevent any current from being drained from battery 450. A user may easily place device 400 into service by pressing and holding ON button 441 for a few seconds. Battery isolation circuit 420 detects the activation of ON switch 441 and then asserts an enable signal 425 to each regulator. After the regulators begin operation, one of them provides a signal back to the battery isolation circuit that causes the enable signal to be maintained after the ON switch is released. In this example, regulator 430 provides voltage VDDP to battery isolation circuit 420 as a signal to maintain the enable signal.

Alternatively, in this example a user may connect device 400 to a charging port 452 that is coupled to charging circuit 450. When this is done, charge_source signal 454 is asserted and provided to battery isolation circuit 420 to cause it to assert the enable signal 425 to the voltage regulators. In this example, the charging port may be configured to receive power from an AC adaptor, for example. There may also be a USB (universal serial bus) port that may be coupled to the charging circuit to allow charging from a USB source. In this manner, connecting the device to either a wall charger or to a USB cable may cause it to leave ship mode and begin normal operation.

FIG. 5 is a schematic of a battery isolation circuit 420 for device 400 of FIG. 4. Battery isolation circuit 420 operates in a similar manner to isolation circuit 220. In this example, bias circuit 522 includes resistor R10, R11 and transistor Q15. R10 is connected to the base of transistor Q15 and is configured to hold control transistor Q15 off, which in turn allows resistor R11 to maintain the enable signal 425 in a low logic state. This causes all of the regulators 430-431 to remain off to block all current flow to the processing logic 401 while the device is in a storage state for shipping or long term storage. As long as the base of Q15 is at or near the same potential as the emitter, transistor Q15 will not conduct any current and thereby regulators 430-431 will not conduct any current. This allows device 400 to be stored for long periods of time with the battery installed without draining the battery charge.

Override circuit 523 is coupled to bias circuit 322 and to a momentary switch 441. The override circuit is configured to override the bias circuit in response to activation of the momentary switch such that the control transistor Q15 is turned on and allows current to flow to the processing logic during an operational state by asserting the enable signal to the regulators.

When ON button 441 is pressed, the base of transistor Q15 is pulled towards ground which allows current to flow through transistor Q15 to bring up the enable signal 425. This in turns enables the system power supply regulators 430-431 to produce regulated voltage VDDC and VDDP that is in turn provided to processing function circuitry 401. The capacitor C10 provides a timed momentary turn on of Q12 which holds Q15 in the on condition for a period of time after momentary switch 441 is released. Once the RESET_OUT signal is deactivated to indicate voltage VDDP is stable and the processing circuit 401 is ready to operate, transistor Q13 is turned on and it holds Q15 in the on condition.

A user of device 400 may decide to store the device for a long period of time. In this case, they may press the reset key 442 and hold it for a period of time. While reset switch 442 is activated, the base of transistor Q13 is tied to ground through resistor R20. After a short period of time, capacitor C12 is discharged by resistors R20 and R22 in parallel and then Q13 is turned off. Once Q13 is turned off, bias circuit 322 will charge capacitor C11 to a high enough value to turn off transistor Q15 after another period of time. In this example, the values of resistor R20, R22, C12, R10, and capacitor C11 are selected to require reset switch 442 be activated for approximately two seconds or more to place device 400 into storage mode. Pressing the reset switch for a period of time that is less than approximately two seconds just performs a normal reset function on processing logic 401.

In some embodiments, a shipmode signal 405 from a general purpose input/output (GPIO) driver may also be used to place device 400 into storage mode in response to an application executed by processing logic 401. This feature may allow software on the device to determine when the device has not been used for an extended period of time. For example, an internal timer or time of day clock may be queried to determine when an extended period of time has passed without other activity. For example, a time period of three or four days or more may be appropriate for some types of devices. Since going into shipmode removes power from all of the processing logic, some device initialization may be required the next time it is restarted, such as time of day, for example. Therefore, the delay period should be long enough so that a user is note unconvinced by this occurrence. For short periods of time, it may be more appropriate to place a device in a conventional low power or hibernate mode in which power is maintained to some critical processing circuitry. In this manner, a device may place itself in ship mode so that the battery life is preserved during extended periods of non-use.

In this example, the reset state for shipmode signal 405 is high. When shipmode signal 405 is set low by software executed in processing logic 401, the base of transistor Q13 is tied to a low logic level through resistor R21. After a short period of time, capacitor C12 is discharged by resistors R21 and R22 in parallel and then Q13 is turned off. Once Q13 is turned off, bias circuit 522 will charge capacitor C11 to a high enough value to turn off transistor Q15 after another period of time. In this example, the values of resistor R21, R22, C12, R10, and capacitor C11 are selected to require shipmode signal 405 be activated for approximately two seconds or more to place device 400 into storage mode.

As mentioned above, a user may connect device 400 to a charging port 452 that is coupled to charging circuit 450. When this is done, charge_source signal 454 is asserted and causes Q12 to turn on, which in turn turns on Q15 to cause it to assert the enable signal 425 to the voltage regulators. In this manner, connecting the device to either a wall charger or to a USB cable may cause it to leave ship mode and begin normal operation.

In this example, ON button 441 is a three terminal switch. When pushed, it connects the start signal 544 and the ONKEY signal 545 both to ground. The ONKEY signal is used to turn on device 400 during normal operation when the device is in a normal operating mode, such as when the device goes into low power mode or a hibernate mode.

Figure 6:
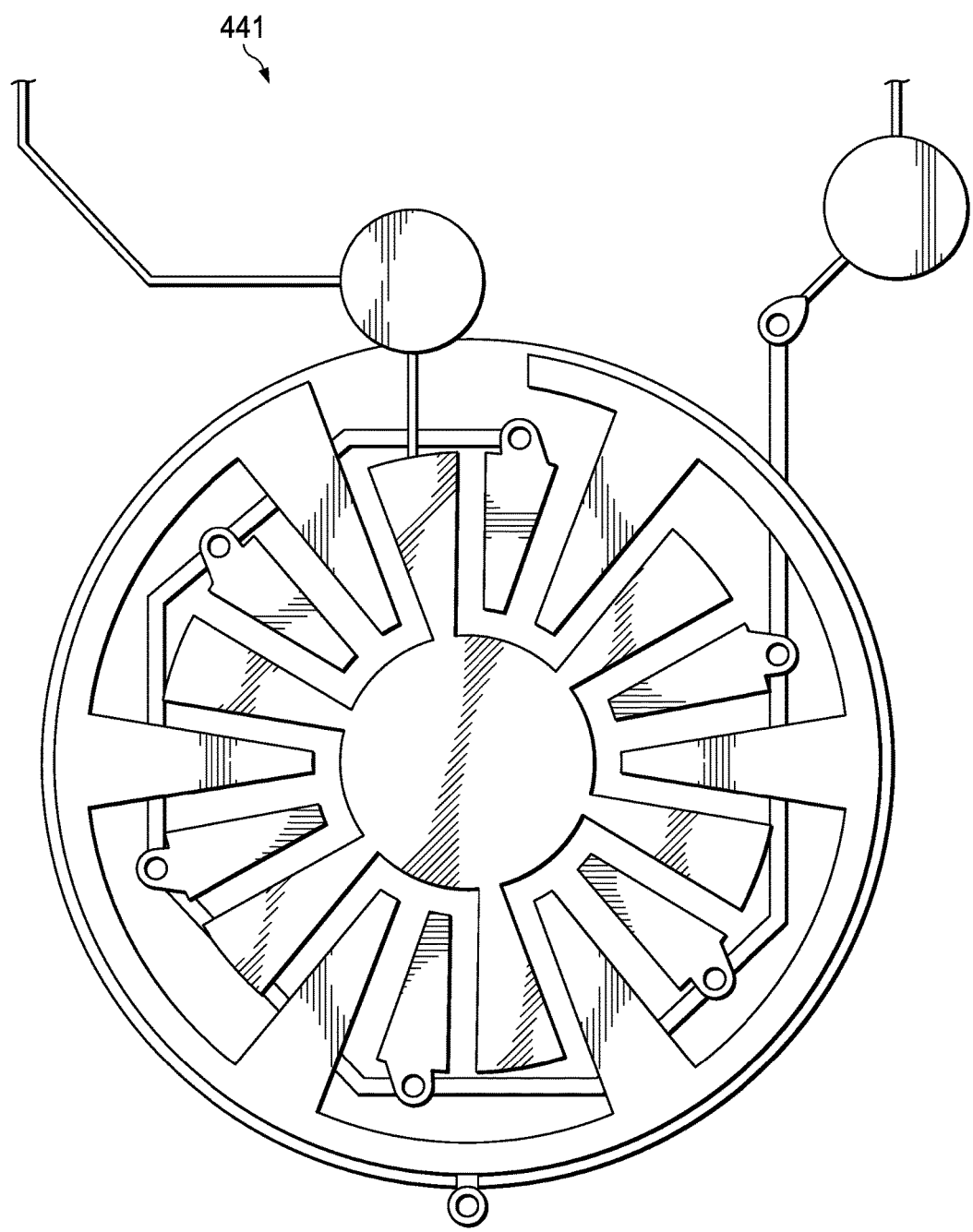
FIG. 6 illustrates a layout for a three terminal switch.

FIG. 6 illustrates a layout for three terminal switch 441. A conductive button is placed above the circular pattern and when depressed connects the various fingers of the patterns together. This provides a low cost double-pole switch that allows the start signal 544 and the ONKEY signal 545 to remain separated when the switch is not activated.

Figure 7:
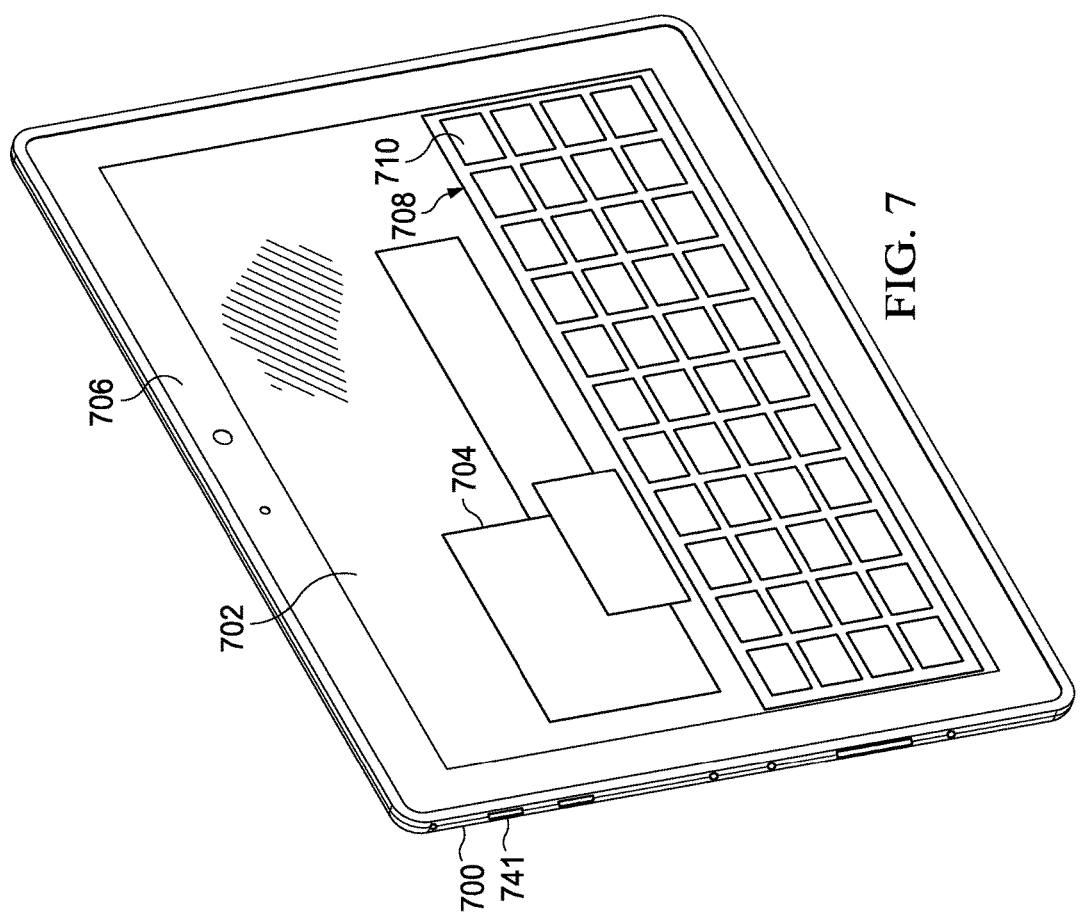
FIG. 7 is an illustration of another example electronic device that includes an electronic pull tab to isolate its battery during extended periods of non-use.

FIG. 7 is an illustration of another example electronic device 700 that includes an electronic pull tab to isolate its battery during extended periods of non-use. the circuitry of the electronic pull tab circuit may be similar to FIG. 3 or FIG. 5, for example. Tablet computer 700 includes a graphical display 702 that may be used to display, among other things, information input to applications executing on the tablet computer 700 and various outputs of the applications. For example, each application may use one or more windows 704 for displaying input and output information, as is well known in computer technology. The graphical display 702 may be, for example, an LCD display. One or more control buttons, such as push button 741, may be provided in some embodiments, such as a power button, volume control buttons, etc.

Tablet computer 700 may not have a dedicated keyboard; instead, one or more applications may provide a virtual, or a "soft keyboard" as illustrated by application window 708 that includes a set of keys 710. Display 702 includes touch detection circuitry that allows a user to interact with the display 702 by translating the motion and position of the user's fingers on the display 702 to provide functionality similar to using an external pointing device, such as a mouse, and a keyboard. A user may use the touch sensitive display 702 to perform operations similar to using a pointing device on a computer system, e.g., scrolling the display 702 content, pointer positioning, selecting, highlighting, etc.

In a similar manner to the devices described above, an electronic switch may be provided between the battery and the device circuitry. This switch may be set in the storage state by pressing a designated one of the virtual keys of keyboard 710 that may act as a reset switch, for example. A software routine may then activate a GPIO output to cause the electronic switch to remove all power from the processing circuitry of device 700. In this state, power is essentially removed from the Lithium Ion battery preserving a charge on the battery for extended periods of storage. When the product is desired to be used or arrives in the hands of a customer, pressing an ON switch 741 re-enables the electronic switch and converts the unit to a normal operational state. Functions are available and supported for this state, including the virtual reset key.

To return the product to the extended storage state, the virtual reset key may be pressed and held which under software control opens up the connection between the battery and the device circuitry. This could also be done using a physical reset switch, as described above.

Once the device is ready to be re-used, the product may be restored to normal operation again through normal operations, such as pressing the ON key, or connecting it to a USB cable or other charging source, for example.

Figure 8:
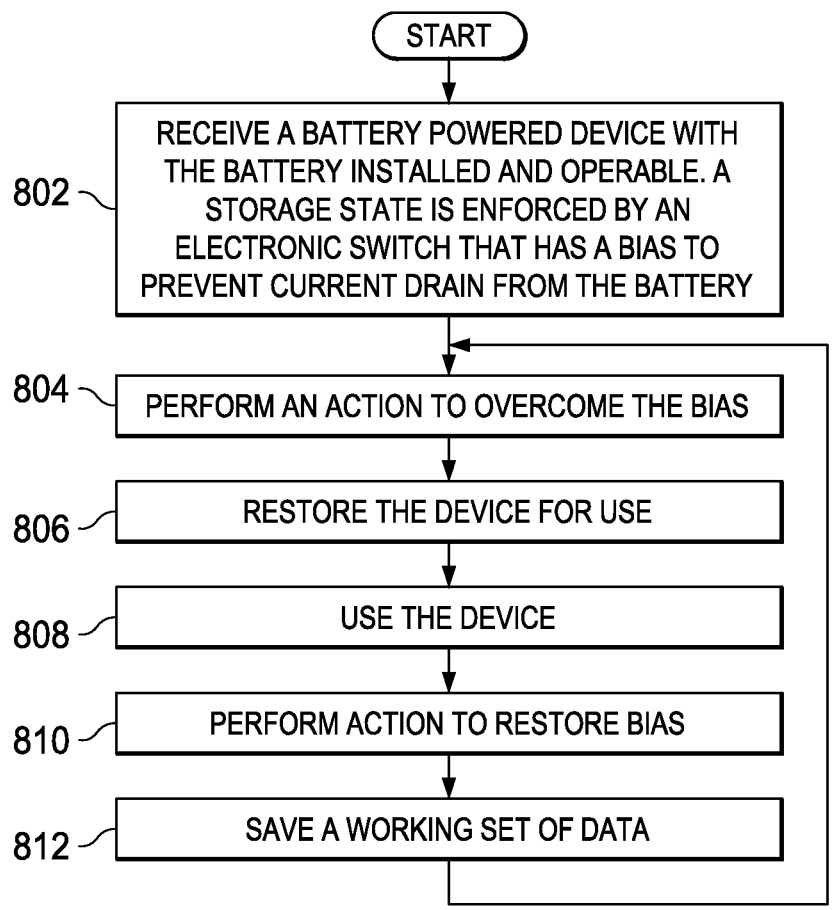
FIG. 8 is a flow diagram illustrating operation of a battery powered device.

FIG. 8 is a flow diagram illustrating operation of the battery powered device. Initially, a user may receive 802 the battery powered device from a vendor with the battery installed in the device in an operable manner. The device was placed in a storage state by the manufacturer so that the battery would not be drained while in the device is in inventory. The storage state is enforced by an electronic switch that has a bias to prevent current drain from the battery.

A user may perform 804 a simple action to overcome the bias such that the electronic switch is turned on and allows current to flow to the device in an operational state. As described above in more detail, the action to overcome the bias may be pressing an ON button on the device for a period of time. Alternatively, the action to overcome the bias may be connecting the device to a source of charging power, for example.

After the device is initialized or restored 806, the user may then use 808 the device for its normal purpose, such as calculating, computing, operation as a cell phone, etc., for example.

At some point, the user may quit using the device and wish to store it for an extended period of time. In order to prevent draining the battery, the user may perform a simple action to restore 810 the bias such that the electronic switch is turned off to return the device to the storage state in which essentially no current is drained from the battery. As described above in more detail, the action to restore the bias may be pressing a momentary switch for a period of time that is longer than a defined timeout period. Alternatively, the action to restore the bias may be pressing a virtual key displayed on a display screen for a period of time that is longer than a defined timeout period, for example.

In some embodiments, a working set of data may be copied 812 into a non-volatile memory storage prior to removing power and entering the storage state. The non-volatile memory may be flash memory or FRAM (Ferroelectric read only memory) for example, that does not require any power to maintain the data.

In this case, when the user again performs an action to overcome 804 the bias on the electronic switch and bring the device out of the storage state, the working set of data may be copied from the non-volatile storage back into working memory to restore 806 the device for use. In this manner, the device may quickly return to a full operational state.

OTHER EMBODIMENTS

While the invention has been described with reference to illustrative embodiments, this description is not intended to be construed in a limiting sense. Various other embodiments of the invention will be apparent to persons skilled in the art upon reference to this description. For example, other embodiments may include various mobile or personal battery powered electronic devices, such as: tablets, digital reading devices, mobile phones, desktop computers, portable computers, cameras, etc., for example.

While lithium batteries were discussed herein, embodiments of the invention may be used for devices with other types of battery chemistry now known or later developed installed to increase storage life of the battery without the need for a mechanical disconnect mechanism.

While the embodiments of FIG. 2 and FIG. 4 illustrated a voltage regulator coupled between the battery and the processing logic, in other embodiments the battery isolation circuit may be coupled to the processing logic without the use of a voltage regulator for systems that are less sensitive to voltage levels, for example.

In some embodiments, when the reset button is activated to place the device in storage mode, the processing logic may copy a working set of data into a non-volatile memory storage, such as a flash memory or FRAM (Ferroelectric read only memory) for example, prior to removing power and entering the storage state. When the device is activated again, it may then copy the working set of data from the non-volatile storage back into working memory and essentially immediately return to the application the device was performing when it was last shutdown without needing to perform a long initialization or boot process.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A battery powered device, comprising:
a battery positioned within a housing of the device;
processing logic configured to perform functions of the device;
an electronic switch coupled between the battery and the processing logic;
a bias circuit coupled to the electronic switch, wherein the bias circuit is configured to hold the electronic switch off to block current flow from the battery while the device is in a storage state; and
an override circuit coupled to the bias circuit and to a start signal generated by an ON switch, wherein the override circuit is configured to override the bias circuit in response to activation of the start signal such that the electronic switch is turned on and allows current to flow to the processing logic in an operational state.

2. The battery powered device of claim 1, wherein the electronic switch is a transistor coupled between the battery and the processing logic.

3. The battery powered device of claim 1, wherein the electronic switch is a voltage regulator coupled between the battery and the processing logic.

4. The battery powered device of claim 1, wherein the ON switch is a three terminal switch, with on terminal connected to a voltage bus, one terminal connected to the start signal, and one terminal connected to an ON signal that restarts the device from a low power state.

5. The battery powered device of claim 1, further comprising a shutdown circuit coupled to the override circuit and to a shutdown signal, wherein the shutdown circuit is configured to inhibit operation of the override circuit such that the electronic switch is turned off in response to activation of the second momentary switch to return the device to the storage state.

6. The battery powered device of claim 5, wherein the shutdown signal is produced by a momentary switch that must be activated for a time period longer than a timeout time defined by the override circuit.

7. The battery powered device of claim 5, further comprising a shutdown signal from the processing logic coupled to the shutdown circuit such that activation of the shutdown signal by the processing logic causes the shutdown circuit to inhibit operation of the override circuit such that the device is returned to the storage state.

8. The battery powered device of claim 7, further comprising a timer function that is configured to activate the shutdown signal after the processing logic is inactive for an extended period of time.

9. The battery powered device of claim 8, wherein the extended period of time is greater than approximately 96 hours.

10. A method for operating a battery powered device, the method comprising:
   receiving the battery powered device from a vendor with the battery installed in the device in a operable manner, wherein the device is in a storage state enforced by an electronic switch that has a bias to prevent current drain from the battery; and
   pressing an ON button on the device such that the electronic switch is turned on and allows current to flow to the device in an operational state.

11. The method of claim 10, further comprising performing an action to restore the bias such that the electronic switch is turned off to return the device to the storage state in which essentially no current is drained from the battery.

12. The method of claim 11, wherein the action to restore the bias comprises pressing a momentary switch for a period of time that is longer than a defined timeout period.

13. The method of claim 11, wherein the action to restore the bias comprises pressing a virtual key displayed on a display screen for a period of time that is longer than a defined timeout period.

14. The method of claim 11, further comprising copying a working set of data into a non-volatile memory storage prior to removing power and entering the storage state.

15. The method of claim 14, further comprising:
   performing an action to overcome the bias such that the electronic switch is turned on and allows current to flow to the device in an operational state; and
   copying the working set of data from the non-volatile storage back into working memory, whereby the device quickly returns to a full operational state.

16. A battery powered device, comprising:
   a battery positioned within a housing of the device;
   processing logic configured to perform functions of the device;
   an electronic switch coupled between the battery and the processing logic;
   means to bias the electronic switch to hold the electronic switch off to block current flow from the battery while the device is in a storage state;
   means for performing an action to overcome the bias such that the electronic switch is turned on and allows current to flow to the processing logic in an operational state; and
   means to restore the bias such that the electronic switch is turned off to return the device to the storage state in which essentially no current is drained from the battery.

* * * * *